US006722151B2

(12) United States Patent
Spinazzola et al.

(10) Patent No.: US 6,722,151 B2
(45) Date of Patent: *Apr. 20, 2004

(54) COMPUTER RACK HEAT EXTRACTION DEVICE

(75) Inventors: R. Stephen Spinazzola, Baltimore, MD (US); Dennis L. Peltz, Perry Hill, MD (US)

(73) Assignee: TOC Technology, LLC, Baltimore, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/383,634

(22) Filed: Mar. 10, 2003

(65) Prior Publication Data

US 2003/0150231 A1 Aug. 14, 2003

Related U.S. Application Data

(63) Continuation of application No. 10/123,255, filed on Apr. 17, 2002, now Pat. No. 6,557,357, which is a continuation-in-part of application No. 09/933,804, filed on Aug. 22, 2001, now Pat. No. 6,574,970, which is a continuation-in-part of application No. 09/842,167, filed on Apr. 26, 2001, now Pat. No. 6,412,292, which is a continuation-in-part of application No. 09/784,238, filed on Feb. 16, 2001, now Pat. No. 6,494,050.
(60) Provisional application No. 60/289,787, filed on May 10, 2001, and provisional application No. 60/289,786, filed on May 10, 2001.

(51) Int. Cl.[7] .............................................. F25D 23/12
(52) U.S. Cl. ........................................ 62/259.2; 62/89
(58) Field of Search ................. 62/89, 259.2; 165/80.3; 361/694, 695, 696

(56) References Cited

U.S. PATENT DOCUMENTS

| | | | |
|---|---|---|---|
| 3,903,404 | A | 9/1975 | Beall et al. |
| 4,089,040 | A | 5/1978 | Paulsen |

(List continued on next page.)

FOREIGN PATENT DOCUMENTS

DE 4111333 10/1992

(List continued on next page.)

*Primary Examiner*—William E. Tapolcai
(74) *Attorney, Agent, or Firm*—Oblon, Spivak, McClelland, Maier & Neustadt, P.C.

(57) ABSTRACT

An air conditioning cooling apparatus and method which includes the steps of supplying cooling air generated from a cooling apparatus into an air passageway formed below a floor; guiding the cooling air in a controlled manner within the air passageway into an equipment assembly disposed on the floor through an opening located in the floor; communicating the cooling air introduced into the equipment assembly in a controlled manner into a plenum and introducing the air released from within the equipment into the plenum and communicating the released air through the cooling apparatus for cooling the released air. The method can permit temperature differential between the air supplied to the air passageway and the air introduced into the plenum from the equipment assembly to be 45° F. to substantially 40° F. so as to reduce the power necessary for operating on the fan of the blowing apparatus, and can also permit a controlled, uniform flow of air to and from the equipment in the equipment assembly.

64 Claims, 11 Drawing Sheets

U.S. PATENT DOCUMENTS

| | | | |
|---|---|---|---|
| 4,158,875 A | 6/1979 | Tajima et al. | |
| 4,196,526 A | 4/1980 | Berti | |
| 4,261,519 A | 4/1981 | Ester | |
| 4,352,274 A | 10/1982 | Anderson et al. | |
| 4,549,472 A | 10/1985 | Endo et al. | |
| 4,653,321 A | 3/1987 | Cunningham et al. | |
| 4,710,096 A | 12/1987 | Erlam | |
| 4,774,631 A | 9/1988 | Okuyama et al. | |
| 4,832,717 A | 5/1989 | Peters | |
| 4,851,965 A | 7/1989 | Gabuzda et al. | |
| 4,874,127 A | 10/1989 | Collier | |
| 5,232,401 A | 8/1993 | Fujita et al. | |
| 5,345,779 A | 9/1994 | Feeney | |
| 5,467,607 A | 11/1995 | Harvey | |
| 5,544,012 A | 8/1996 | Koike | |
| 5,646,050 A | 7/1997 | Li et al. | |
| 5,657,641 A | 8/1997 | Cunningham et al. | |
| 5,671,805 A | 9/1997 | Stahl et al. | |
| 5,681,219 A | 10/1997 | LeFevre et al. | |
| 5,700,190 A | 12/1997 | Johnson et al. | |
| 5,718,628 A | 2/1998 | Nakazato et al. | |
| 5,765,743 A | 6/1998 | Sakiura et al. | |
| 5,826,432 A | 10/1998 | Ledbetter | |
| 5,910,045 A | 6/1999 | Aoki et al. | |
| 5,934,368 A | 8/1999 | Tanaka et al. | |
| 5,942,049 A | 8/1999 | Li et al. | |
| 5,949,646 A | 9/1999 | Lee et al. | |
| 5,995,368 A | 11/1999 | Lee et al. | |
| 6,052,282 A | 4/2000 | Sugiyama et al. | |
| 6,088,225 A | 7/2000 | Parry et al. | |
| 6,132,309 A | 10/2000 | Panelli et al. | |
| 6,151,903 A | 11/2000 | Hironaka | |
| 6,185,098 B1 | 2/2001 | Benavides | |
| 6,186,890 B1 | 2/2001 | French et al. | |
| 6,193,601 B1 | 2/2001 | Torczynski | |
| 6,198,628 B1 | 3/2001 | Smith | |
| 6,222,729 B1 | 4/2001 | Yoshikawa | |
| 6,243,261 B1 | 6/2001 | Janik et al. | |
| 6,264,550 B1 | 7/2001 | Matsumoto | |
| 6,412,292 B2 * | 7/2002 | Spinazzola et al. | 62/89 |
| 6,557,357 B2 * | 5/2003 | Spinazzola et al. | 62/89 |

FOREIGN PATENT DOCUMENTS

| | | |
|---|---|---|
| DE | 43 30 922 A1 | 3/1995 |
| DE | 43 30 925 A1 | 3/1995 |
| DE | 44 13 128 A1 | 10/1995 |
| DE | 44 13 130 A1 | 10/1995 |
| DE | 196 41 552 C1 | 12/1997 |
| DE | 197 14 838 A1 | 10/1998 |
| DE | 197 14 856 A1 | 10/1998 |
| DE | 198 17 917 A1 | 10/1999 |
| DE | 198 37 705 A1 | 3/2000 |
| DE | 198 42 561 A1 | 4/2000 |
| EP | 0 190 835 | 8/1986 |
| JP | 62-186147 | 8/1987 |
| JP | 362202949 A | 9/1987 |
| JP | 363222916 A | 9/1988 |
| JP | 1273395 | 11/1989 |
| JP | 402098197 A | 4/1990 |
| JP | 402192534 A | 7/1990 |
| JP | 3085796 | 4/1991 |
| JP | 3085797 | 4/1991 |
| JP | 3177096 | 8/1991 |
| JP | 4-203833 | 7/1992 |
| JP | 4368199 | 12/1992 |
| JP | 405106888 A | 4/1993 |
| WO | WO 96/34519 | 10/1996 |
| WO | WO 98/45934 | 10/1998 |

* cited by examiner

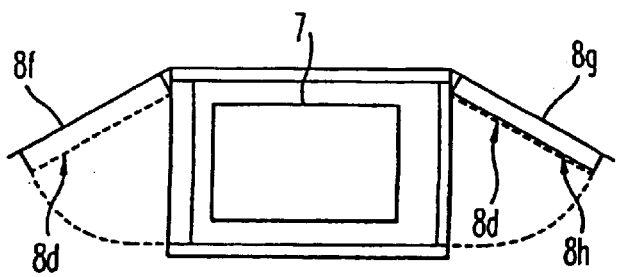
FIG. 16
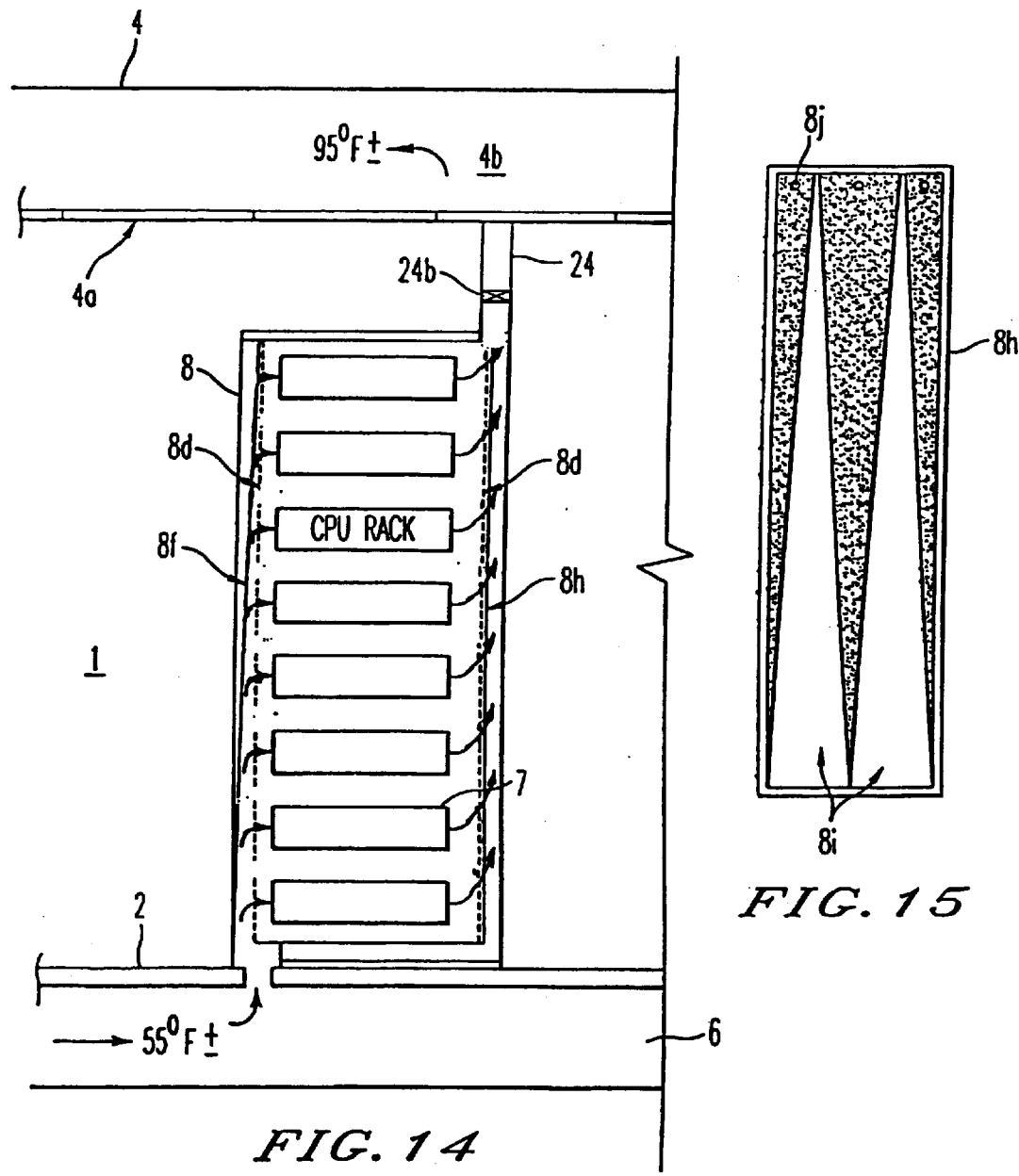
FIG. 15
FIG. 14

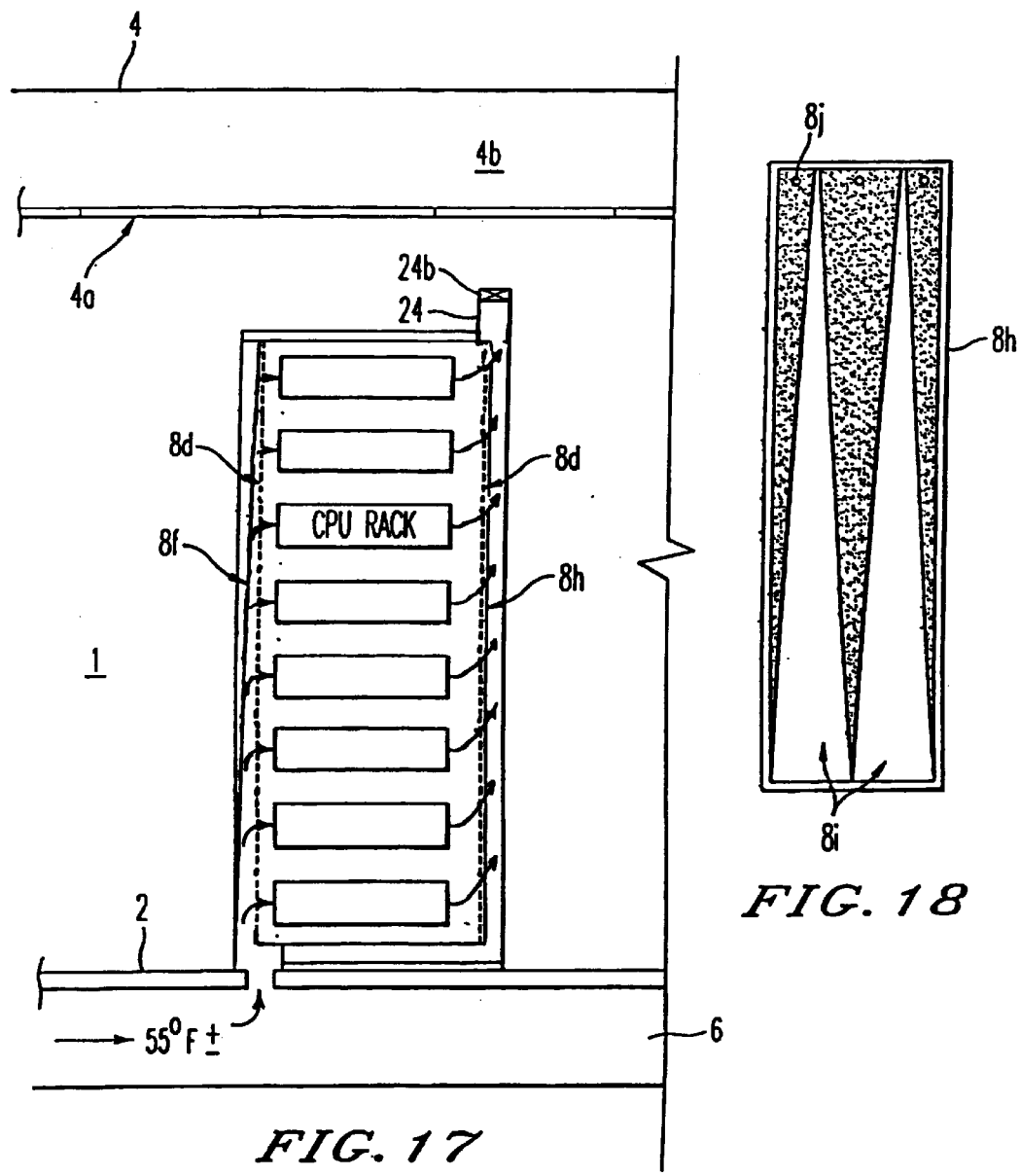

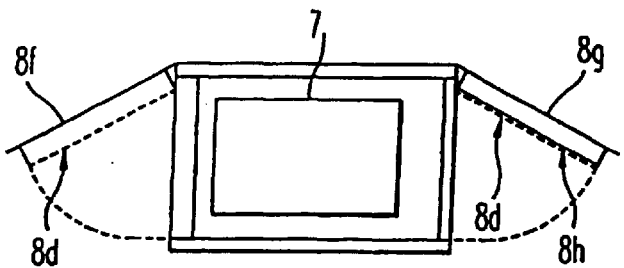
FIG. 25
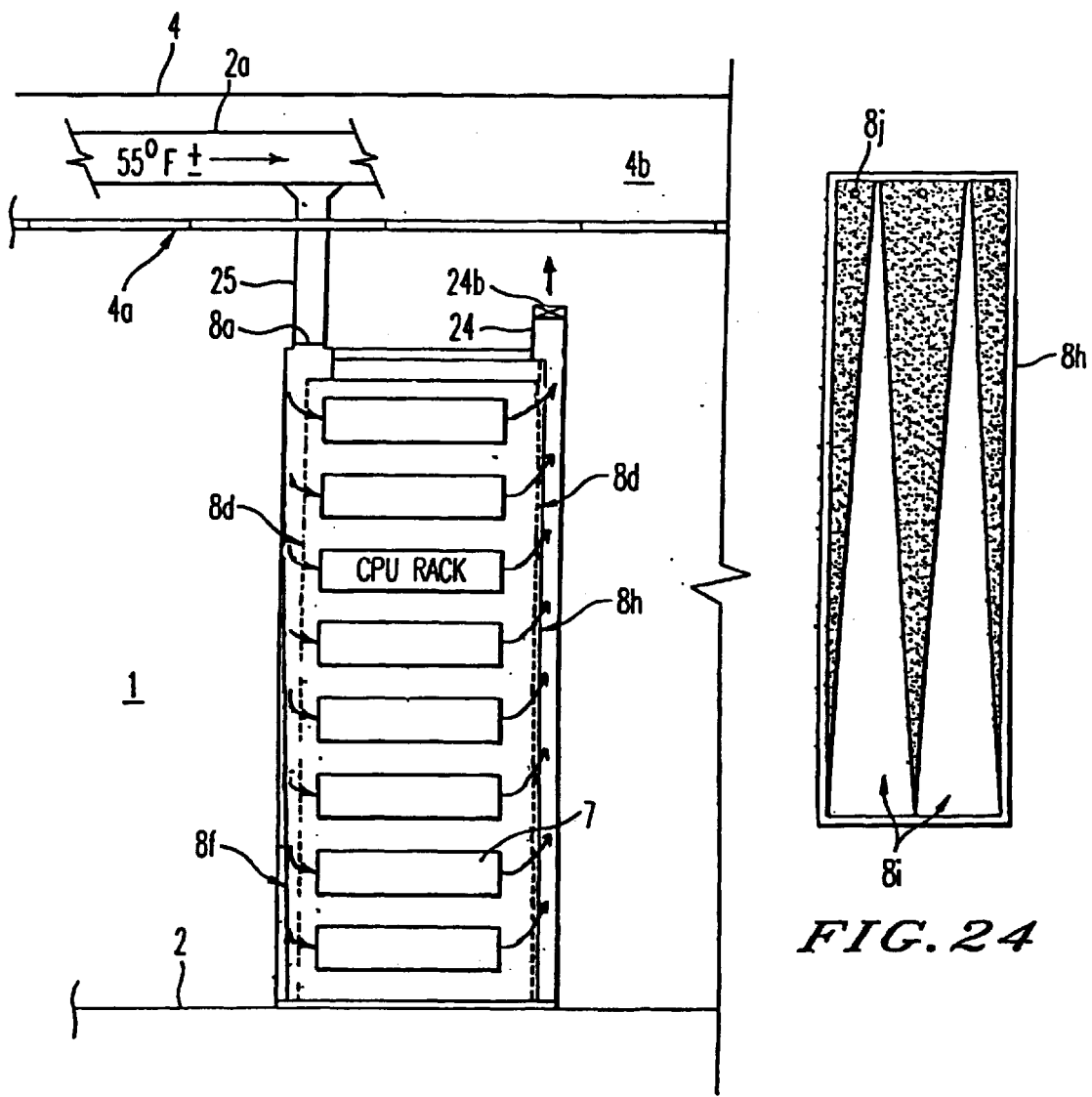
FIG. 24
FIG. 23

COMPUTER RACK HEAT EXTRACTION DEVICE

CROSS REFERENCE TO RELATED APPLICATIONS

The present application is a continuation of U.S. application Ser. No. 10/123,255, filed Apr. 17, 2002, now U.S. Pat. No. 6,557,357 which is a continuation-in-part of U.S. application Ser. No. 09/933,804, filed Aug. 22, 2001, now U.S. Pat. No. 6,574,970 which is a continuation-in-part of U.S. application Ser. No. 09/842,167, filed Apr. 26, 2001, now U.S. Pat. No. 6,412,292 and which is a continuation-in-part of U.S. application Ser. No. 09/784,238, filed Feb. 16, 2001, now U.S. Pat. No. 6,494,050 and also claims the benefit of U.S. Application Serial No. 60/289,787 filed May 10, 2001 and U.S. Application Serial No. 60/289,786, filed May 10, 2001, the disclosure of each of which is herein incorporated by reference.

BACKGROUND OF THE INVENTION

1. Field of the Invention

The present invention relates to a computer room reduced air flow method and assembly but is not limited to use in computer rooms and instead can be utilized with respect to any equipment assembly requiring cooling which is positioned in a room. The method and assembly described below permits control of the flow of cooling air within equipment assembly and achieving energy savings while reducing the amount of air required to cool electronic/heat generating equipment, where a computer rack heat extraction device (CRHED) or similar device such as a custom air handling unit (AHU) is utilized. The method and apparatus permits the collection of heat generated, for example, by the rack electronic equipment.

2. Discussion of the Background

The conventional computer room method and assembly illustrated in FIG. 1 exemplifies the approach for cooling electronic equipment commonly used currently wherein an array of racks of equipment are positioned on a raised floor. FIG. 1 illustrates an air conditioning system used in the method and apparatus of a conventional system wherein a room space 1 defined by a room floor, sidewalls 3 and a ceiling 4 having a plurality of ceiling panels is provided. The room floor 2 is positioned a predetermined distance above a base floor 5 such that the room floor 2 and the base floor 5 in combination form a double floor structure having a free space 6 (i.e. air passageway) formed therein. A rack 7 for one or more computer processing units (CPU) is disposed on the floor 2 wherein electronic cables for the rack are capable of being housed in the free space 6 of the double floor structure but can be specifically communicated to the rack separate from the free air space if desired.

In installing each of the CPUs or other equipment on the rack on the floor, a plurality of support members can be provided which are stationary by being fixed by bolts or similar fastening elements to predetermined positions on the floor 2.

The rack 7 is positioned in a casing 8 having air inlets 8a and air outlets 8b formed respectively in a bottom plate of the casing 8 and in the ceiling portion of the casing 8. A computer case fan 9 is operable during operation of the equipment 7 so as to assist the air flow upwardly from the casing through the air outlets 8b. As shown in FIG. 1, the CPU members are arranged in an air passageway formed within the casing 8. The floor 2 includes a plurality of floor panels located on pedestals 2b, one panel 2a of which includes a plurality perforations to allow air flow as indicated by the arrows to freely flow without control through the front of the outside housing of casing 8, through the CPU rack 7 and out the back passageway or cavity of casing 8. A cooling unit 14 is positionable either inside or outside the room 1 and is communicated with a heat exchanger or other air conditioning equipment so as to permit a cooling coil 15 located within unit 14 to cool air blowing therethrough. The cooling unit 14 also includes a fan 16 which is positionable below cooling coil 15. An inlet 20 is provided to allow air from the room to flow thereinto from the room, the air in the casing 8 mixing with room air prior to being introduced into the cooling unit 14, as illustrated in FIG. 1. The fan 16 is therefore arranged between the air inlet 20 and an air outlet 22 located at the lower portion of unit 14 and feeds air into the free space 6 located above the base floor 5. The fan 16 thus permits air in the interior of the room to be sucked into the air inlet 20 of the casing 8 and also permits the air in the room to pass through cooling coil 15. The air in the room is typically at a temperature of 75° F.±.

The above-noted approach for cooling electronic equipment thus permits the area in the free space 6 below the raised floor 2 to be used for cable management and also serve as a supply air plenum. The computer room air conditioning units (CRACUs) utilize cooling coil 15 to cool the air. The CRACUs supply conditioned air at approximately 55° F. to the under floor supply air plenum or free space 6. Floor tiles with perforations or slots to allow air to flow from under the raised floor to above the floor are positionable below or are adjacent to the rack 7. Other perforated tiles are positioned throughout the room to provide air supply to other heat generating equipment and to maintain the room in an ambient environment.

As illustrated by the arrows in FIG. 1 showing the air flow, the conditioned air is then drawn into the rack 7 by either convection by air flow from perforated panels 2a into the casing 8 or by fans 9 located in the top of the racks. The air enters the racks at a temperature of approximately 55° F., is heated by the CPUs or other electronics, and flows upwardly out of the rack at approximately a temperature of 95° F. The warm air leaves the rack and mixes with the conditioned ambient environment of the room 1 which is at a temperature of approximately 75° F., and thus returns to the CRACU's at a temperature of approximately 75° F. as illustrated in FIG. 1.

In view of the foregoing, it can be understood that conventional CRACU's have a 20° delta T (+ or −4° F.) across the cooling coil 15. This is also coincident with the space delta T which is defined as being the difference in temperature between the air supplied to the space, and the air returned from such space. The temperature of the air returned from the space is usually coincident with the ambient space temperature such that the return air at 75° F. enters the return on top of the CRACU's, passes across the cooling coil 15 and is discharged at a temperature of substantially 55° F. at the bottom of unit 14 so as to pass into the free space 6. The required air quantity to cool such space is a direct function of the space delta T. The equation set forth below is used to calculate the required air flow or cubic feet per minute (CFM) of air to cool a space:

$$CFM = BTUH/1.08 \times \text{delta } T$$

From the foregoing, it can be appreciated that the disadvantage of the conventional system set forth above requires a significant amount of fan horsepower for operation and thus the need has arisen for reducing the amount of horsepower necessary to operate the fan 16. In addition, the flow of cooling air across the rack is uncontrolled so as to not necessarily adequately cool each equipment member in the rack 7.

The devices of the type described above are exemplified by, for example, by U.S. Pat. No. 5,718,628; U.S. Pat. No. 4,774,631 and U.S. Pat. No. 5,910,045, the disclosure of each of which is herein incorporated by reference, as is the disclosure of provisional application Nos. 60/289,787 and 60/289,786, the priority of each is claimed in the present application.

SUMMARY OF THE INVENTION

One object of the present invention is to provide a flow control device upstream and downstream of the rack so as to effectively and uniformly cool each item of equipment of the rack.

An additional object of the present invention is to provide a method and apparatus which utilizes an increased delta T to reduce their required air quantity, thus resulting in a reduced airflow method and apparatus. Specifically, the present invention utilizes approximately 40° F. delta T to reduce the CFM by substantially 50%. The substantially 50% reduction in the airflow will serve to effectively correspondingly reduce the required power by substantially 50%, resulting in substantial energy savings. A key element of the method and apparatus is an increase in delta T above what is conventionally used. The present invention is capable of operating in a range of delta T from 25° F. to 45° F. In this regard, it is noted that the use of a 40° F. in the description set forth below is solely exemplary in illustrating device and greater or lesser temperature variations are possible.

An object of at least one embodiment of the present invention is to provide an air conditioning method and apparatus which utilizes the steps of supplying cooling air generated from a cooling apparatus into an air passageway formed below a floor; guiding the cooling air within the air passageway into an equipment assembly disposed on the floor through an opening located in the floor; communicating the cooling air introduced into the equipment assembly into a plenum and introducing the air released from within the equipment into the plenum for communicating such released air to the cooling apparatus. The method may also include the step of guiding the air from the equipment assembly through at least one duct into the plenum and may include the step of cooling the cooling air generated from the cooling apparatus to a temperature of substantially 55° F. while also heating the air released from the equipment assembly to a temperature of substantially 95° F. prior to introducing such air to the cooling apparatus so as to form a closed loop in terms of cycling of the air through the cooling assembly and the equipment assembly.

A further object of the present invention is to obtain a temperature differential between the air supplied to the air passageway or plenum from the cooling apparatus and the air introduced into the plenum from the equipment assembly so as to be substantially 40° F., thus permitting lower power requirements of the fan utilized to assist flow of the air in the closed loop.

A further object of the present invention is to position the fan between the cooling apparatus and the air passageway so as to permit blowing of the air into the passageway towards the equipment assembly, although it is understood that the fan can be located anywhere within the closed loop so as to assist flow of air between the blowing apparatus and the equipment assembly.

A further object of the present invention is to provide a method and apparatus wherein the cooling assembly is located either within or outside the computer room, the equipment assembly comprising either at least one computer processing unit or other type of processing unit in combination with an additional heat generating equipment or without such equipment. In addition, a further object of the present invention is to cool equipment assembly generating heat which does or does not include computer equipment.

An additional object of the present invention is to provide an air conditioning assembly for performing the method described above.

BRIEF DESCRIPTION OF THE DRAWINGS

Various features objects and attendant advantages of the preferred embodiments are illustrated in the figures of the present application which serves to explain the principles of the invention and which includes reference numerals which designate the same or similar elements, wherein:

FIG. 14 shows a fifth embodiment of the equipment assembly and related structure of the present invention;

FIG. 15 is a side elevational view of the solid panel in the embodiment shown in FIG. 14;

FIG. 16 is a top plan view thereof showing the panels of the equipment assembly in an open position;

FIG. 17 shows a sixth embodiment of the equipment assembly and related structure of the present invention;

FIG. 18 is a side elevational view of the solid panel in the embodiment shown in FIG. 17;

FIG. 19 is a top plan view showing the panels of the equipment assembly in an open position;

FIG. 23 shows an eighth embodiment of the equipment assembly and related structure of the present invention;

FIG. 24 is the side elevational view of the solid panel in the embodiment shown in FIG. 23; and FIG. 25 is a top plan view thereof showing the panels of the equipment assembly in an open position.

DESCRIPTION OF THE PREFERRED EMBODIMENTS

Figure 1:
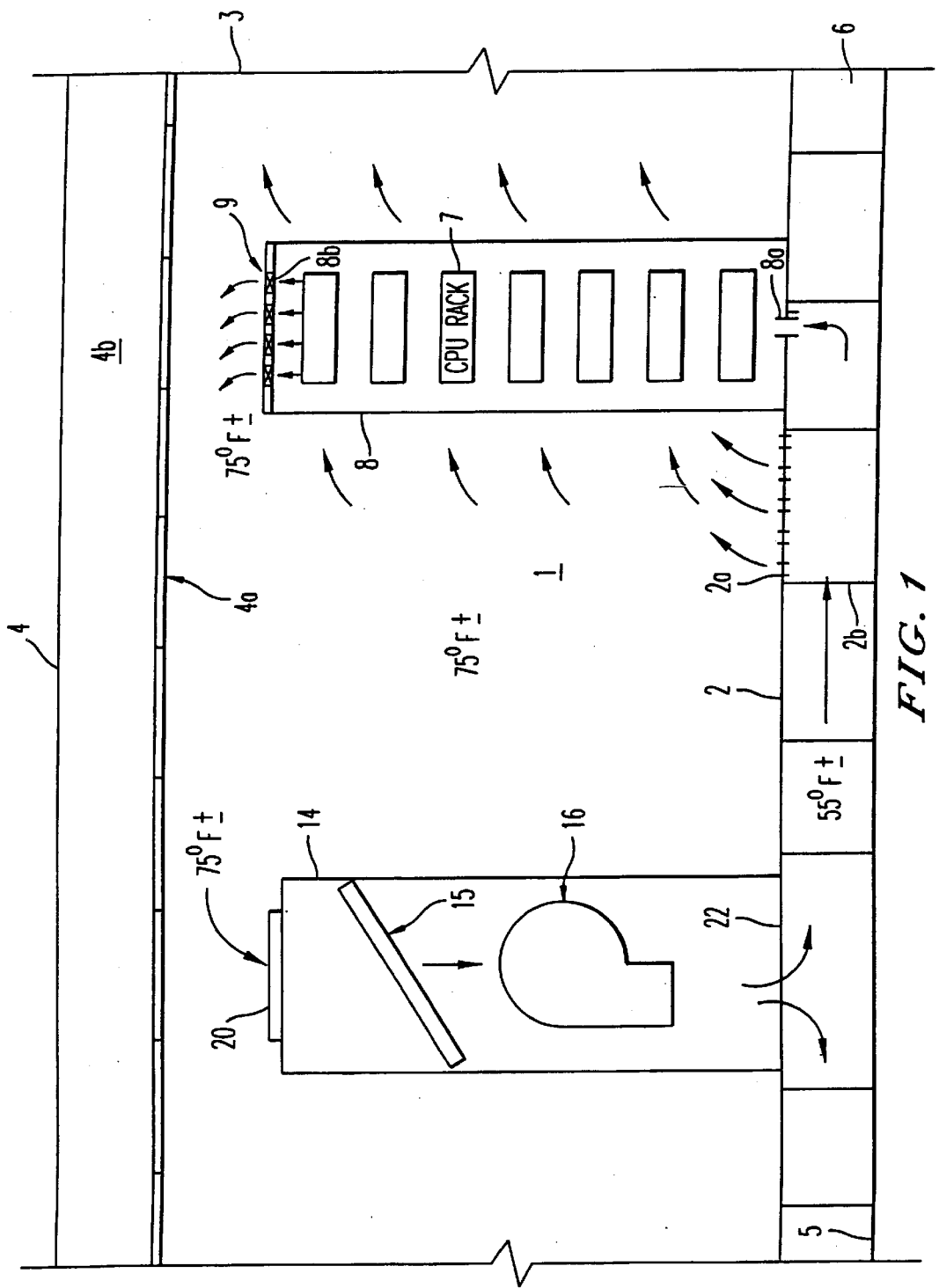
FIG. 1 illustrates an air conditioning method and apparatus used in a conventional system.

FIGS. 2–5 shows an air conditioning system used in a method and apparatus according to the invention described in the applications earlier filed by applicants. As shown therein, the room space is defined by a room floor 2, side walls 3 and upper ceiling 4, a lower ceiling 4a formed, for example, of ceiling tiles defining a ceiling plenum 4b, and a base floor 5. The room floor 2 is positioned a predetermined distance from the base floor such that the room floor and the base floor 5 collectively form a double floor structure having a free space 6 or air passageway formed therein within which electric cables may also be housed.

Figure 2:
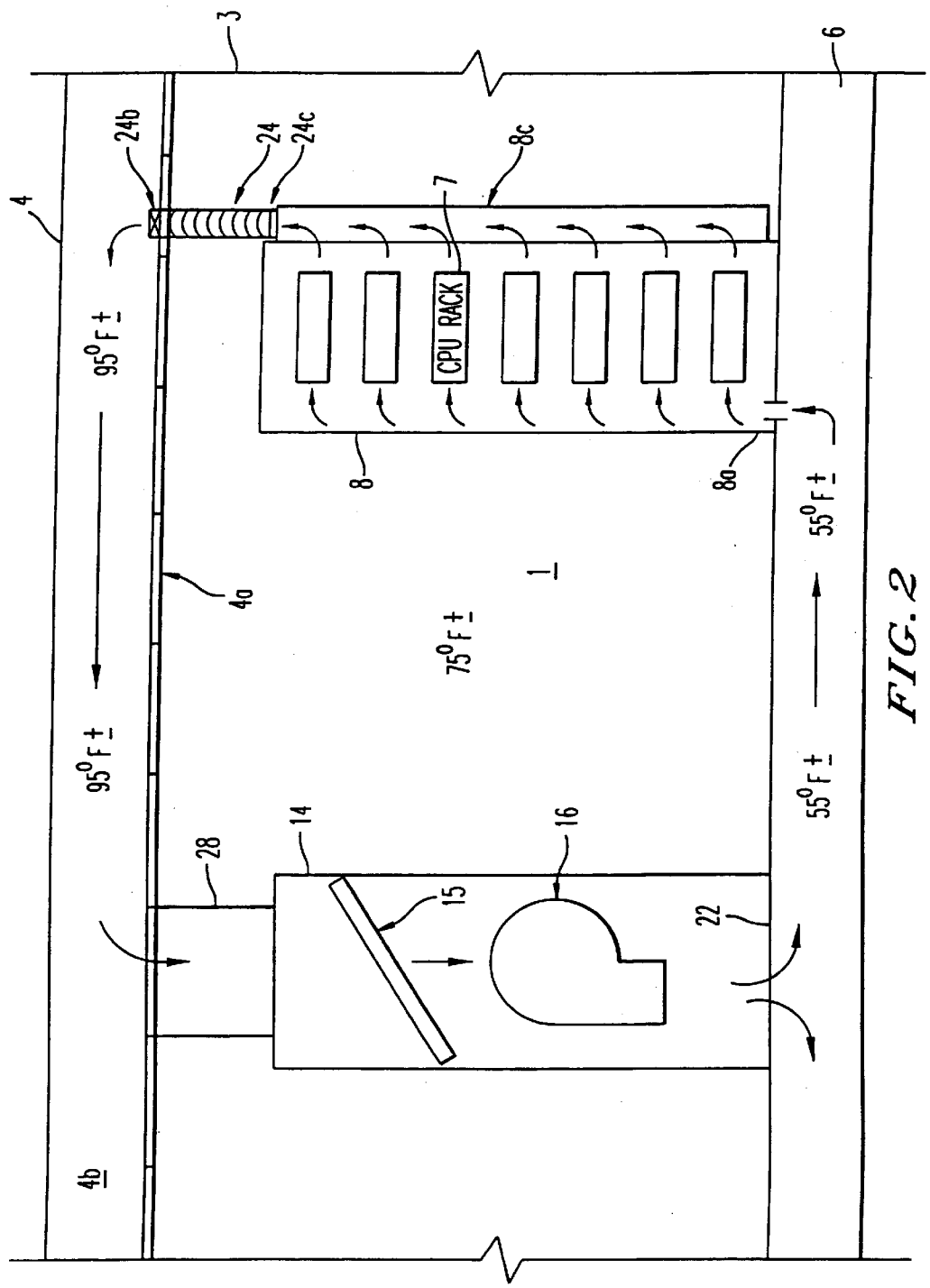
FIG. 2 illustrates an embodiment of the described in parent application Ser. No. 09/784,238 utilizing a single duct.

As shown in FIG. 2, air flow from the space 6 can enter one side portion of each of the CPU racks and flow across the same towards a plenum 8c which can run the full height of the equipment assembly so as to permit air to flow across each CPU in the rack and then flow upwardly towards a plurality of ducts 24. The ducts 24 are sealed with respect to the equipment assembly by, for example, rubber gaskets 26 with similar rubber gaskets 26 being provided between the duct 24 and the lower ceiling 4a. Also provided are computer case fans 24a and 24b, if desired, to assist in air flow through the ducts 24. The location of fan 24b can either be immediately upstream or downstream of the equipment assembly or be positioned at both locations to assist in airflow through the equipment assembly, as would be understandable to one of ordinary skill in the art.

Figures 3, 4:
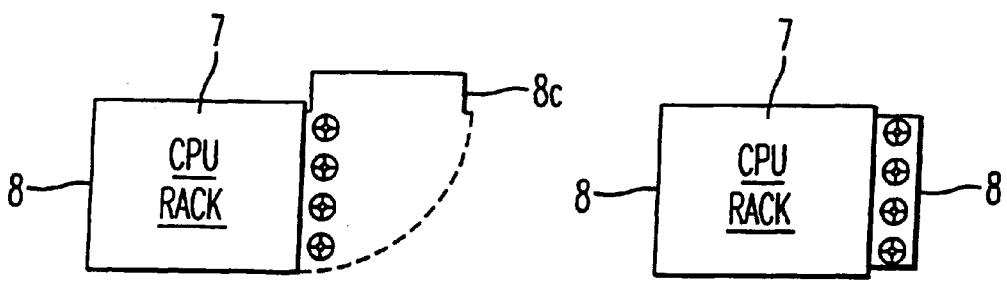
FIG. 3 illustrates a top plan view for the invention of FIG. 2 showing a plenum for the equipment assembly in an open position.
FIG. 4 illustrates the structure of FIG. 3 but wherein the plenum for the equipment assembly is in a closed position.

As illustrated in FIGS. 3 and 4, the plenum 8c is, for example, made of sheet metal hinged by piano type hinges 8b to the equipment assembly with the CPUs themselves being capable of being attached to the equipment assembly casing by quick connect type screws or other fasteners.

Figure 5:
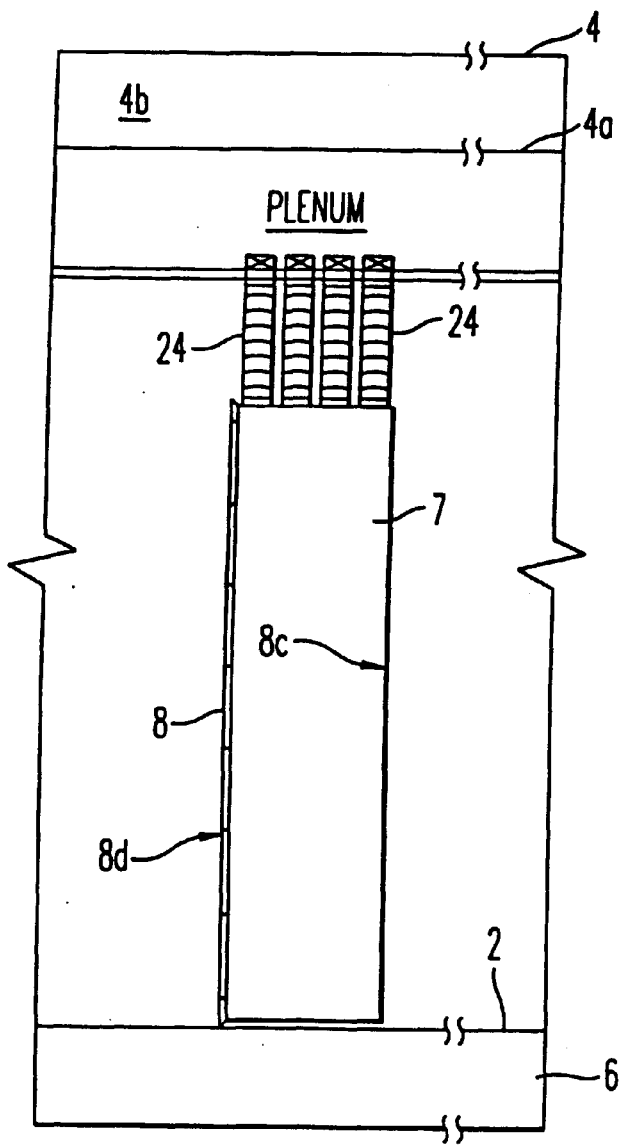
FIG. 5 shows a rear view of the equipment assembly including a sheet metal plenum which is attachable to the equipment by, for example, a piano-type hinge along one edge thereof which is secured to the equipment assembly with the CPU rack being attachable to the equipment assembly by, for example, quick connect type screws.

As illustrated in FIG. 5, the plurality of ducts 24 can be utilized to help assist airflow to the plenum 4b formed between ceiling 4 and lower ceiling 4a. As illustrated in FIG. 2, air flowing from the cooling coil is at substantially 55° F. while the temperature of the air existing from the equipment assembly to the plenum in the ceiling is at substantially 95° F. and is kept separate from the air in the room which is at a temperature of 75° F. The air in the plenum 4b is fed via a duct 28 downward towards the cooling coil 15 in the cooling assembly 14 and is thus cooled to a temperature of substantially 55° F. Therefore, in the above-noted formula, it can be understood that by doubling the delta T from 20° to 40°, it is possible to reduce by 50% the required airflow or CFM of air to cool the space. Particularly, the reduced airflow approach utilizes an increased delta T to reduce the required air quantity movable by the fan 16. More specifically, it is proposed to use an approximately 40° delta T to reduce the CFM by 50%, the 50% reduction airflow effectively reducing the required fan horsepower by 50% resulting in substantially energy savings. Based upon experimentation utilized in accordance with the present invention, a key aspect of the present invention is to provide an increase in delta T above what is conventionally utilized with it being noted that the approach proposed by the present invention is workable at a range of delta T from 20° F. to 50° F.

From the foregoing, it can be appreciated that the cooled supply of air at 55° F. is discharged into the raised floor 2, the cooled air entering the computer room 1 through, for example, perforated floor tiles in from of or under each CPU rack. A supply of cool air at approximately 55° L will be pulled horizontally or vertically through the electrical equipment cabinet by the CRHED, and discharged into the ceiling plenum at approximately 95° F. such that the 40° F. delta T (i.e., 95° F.–45° F.) comprises the effective space delta T. The CRHED may comprise a sheet metal (or a similar rigid material) housing which is between 3 inches and 6 inches deep and attached to the back of the cabinet/rack. The supplemental fans 24a, 24b as part of the CRHED can provide the mechanical means to move the air through the cabinet/rack. Perforated floor tiles can be located at each electronic rack and throughout the room to maintain the room ambient conditions.

As can be appreciated from the foregoing, the purpose of the device is to collect the heat dissipated by the computer equipment or other equipment generating heat in the rack, and channel it so that the warm air is discharged into the ceiling plenum 4b. The primary reason for discharging heat into the plenum is to provide a method of returning the warm air (at approximately 95° F.) directly to the CRACU's. The CRACU's will be modified from the conventional configuration shown in FIG. 1 with a return plenum connecting the open return to the top of the ceiling plenum. This completes the closed air loop and allows the CRACU's to take return air at 95° F., cool such air to 55° F. so as to create the 40° delta T required for the reduced airflow.

An alternate embodiment as part of this approach may use custom air handling units (AHU's). These AHU's serve to replace the CRAHU's to supply conditioned air to the space. The AHU's can be located, for example, in mechanical rooms adjacent to the raised floor space for ducting the supply air under the raised floor, and taking return air from the ceiling plenum. This approach would also allow for the use of an enthalpy economizer allowing for greater energy conservation. Thus, the air conditioning equipment (AHU's and CRACU's) referred to above encompasses the use of an enthalpy economizer or similar device. In addition, a duct directly connecting casing 8 and casing 14 is possible without being located in the ceiling. Here the term "duct" is intended to be the equivalent of plenum.

In view of the foregoing, significant improvements are provided by the present invention as compared with the conventional approach in that (1) the use of a 40° F. delta T (approximately) to reduce energy consumption is obtainable, (2) the collection of the heat from the electronics equipment with CRHED is possible and (3) it is possible to direct the heat to the ceiling plenum and return it to the CRACU or other AHU, as desired to obtain the efficiencies described above.

Figure 7:
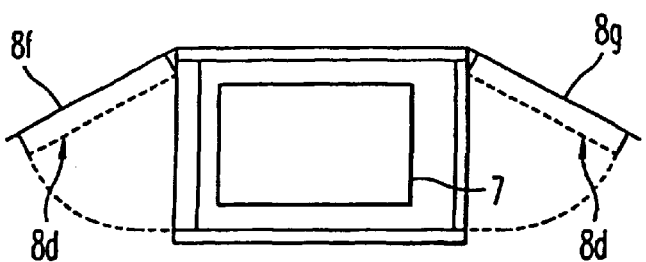
FIG. 7 is a top plan view thereof with the panels of the equipment assembly of FIG. 6 an opened position.
Figure 6:
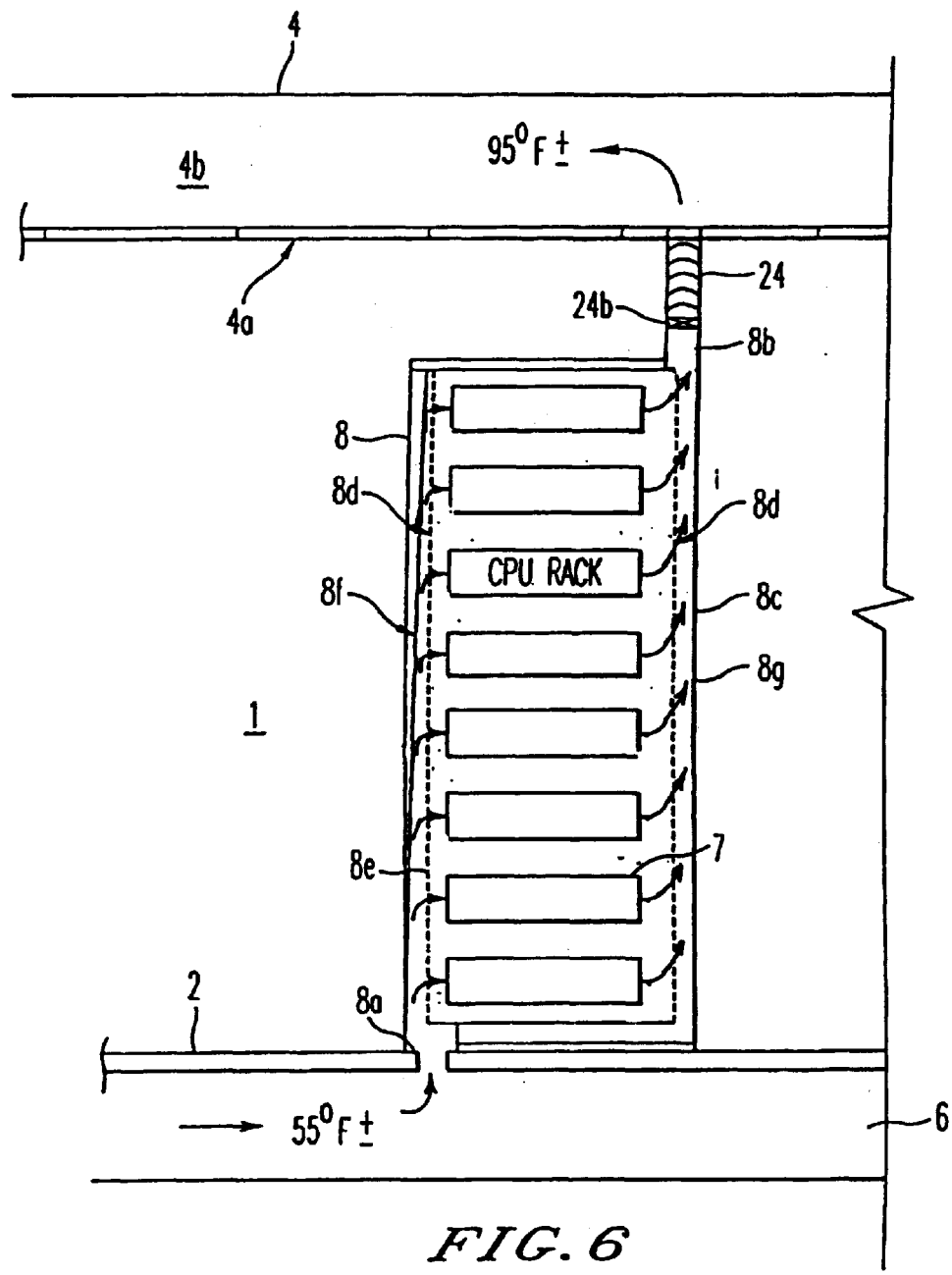
FIG. 6 illustrates a first embodiment of the equipment assembly and related structure according to the present invention.

FIGS. 6 and 7 illustrate a first embodiment of the present invention which is similar in structure and overall operation to that of FIGS. 2–5 but wherein the equipment assembly and the structure channeling the flow of conditioned air thereto and the heated air therefrom have been modified.

FIG. 6 shows the casing 8 as having an inlet 8a communicated to an upstream or front plenum 8e formed in a solid panel 8f which channels cooled air through the perforated panel 8d. As can thus be appreciated, in this embodiment a solid plate is utilized within the front door, the plate being tapered or angled in the direction of the flow of air. The angled solid plate allows for a more uniform airflow across the vertical face on the perforated panel 8d. The more uniform air flow provides for better cooling of the equipment within the rack 7. Also shown is an outlet 8b, a back or downstream plenum 8c, perforated panels 8d and a rear panel 8g which forms a hollow channel between the wall thereof and the perforated panel 8d.

Figures 8, 9:
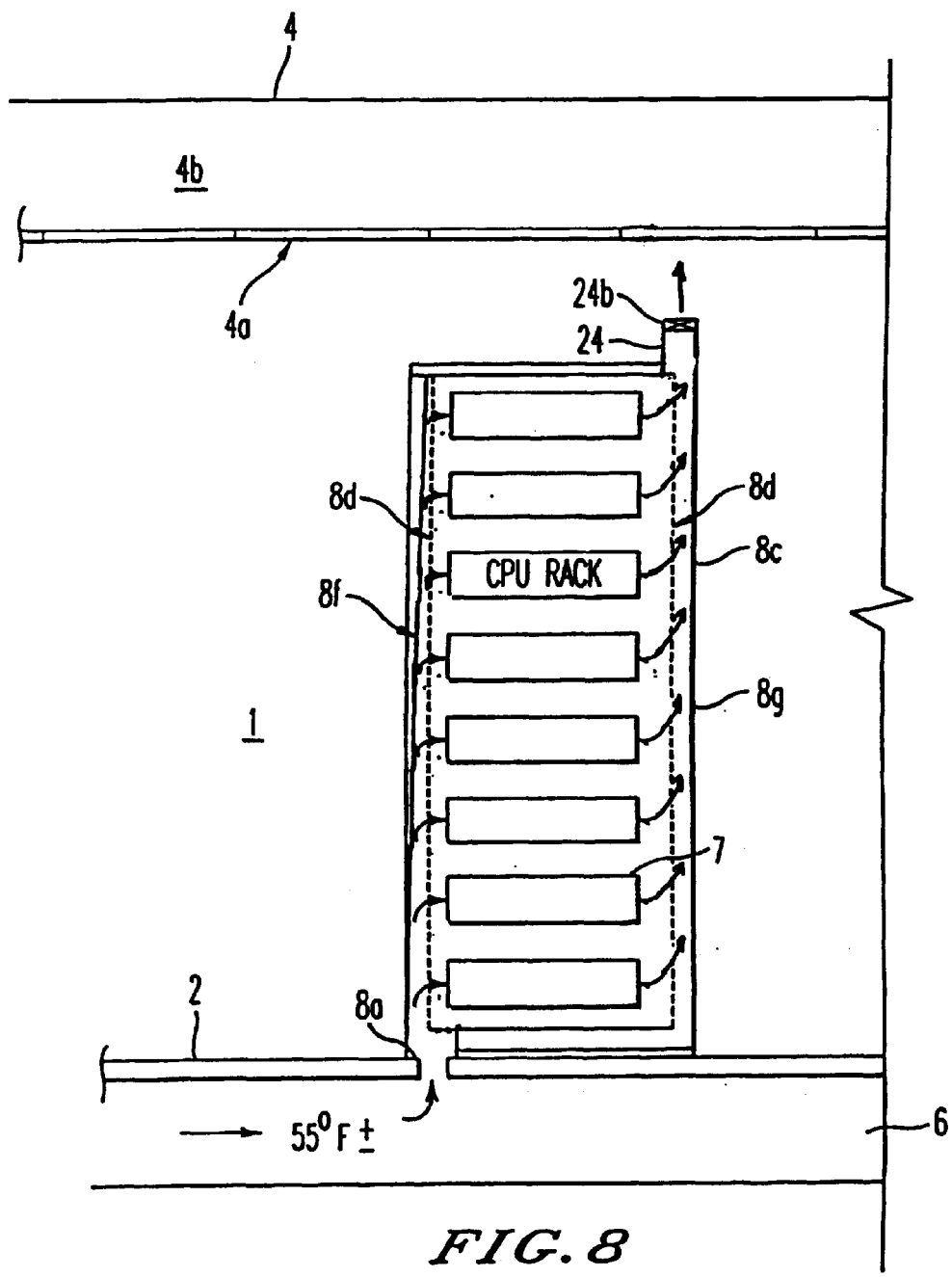
FIG. 8 illustrates a second embodiment of the equipment assembly of the present invention.
FIG. 9 is a top plan view thereof with the panels of the equipment assembly of FIG. 8 being shown in an open position.

FIGS. 8 and 9 illustrate a second embodiment of the present invention which differs from that of the first embodiment in that the outlet duct 24 communicates the heated air back into the room 1. A fan 24b can be used to assist the flow in duct 24 towards plenum 4b spaced from the upper ceiling 4. Alternatively, in any of the embodiments of the present invention, the duct could communicate the heated air to a position remote from the room or be vented to atmosphere.

Figure 11:
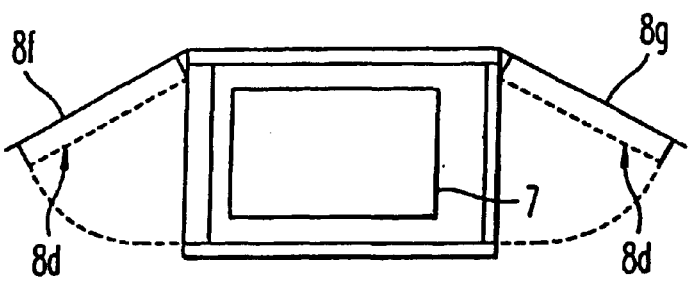
FIG. 11 is the top plan view thereof with the panels of the equipment assembly in an open position.
Figure 10:
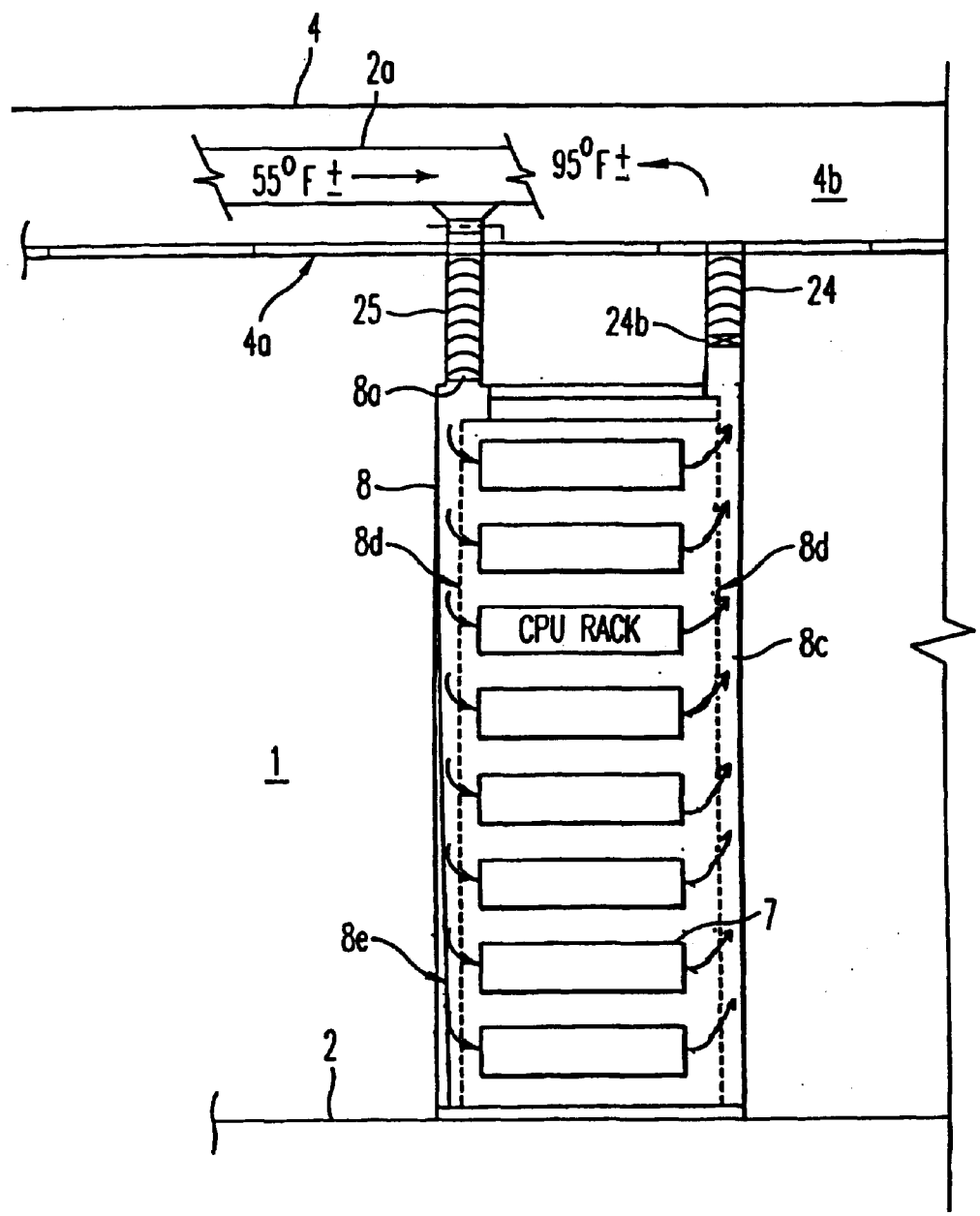
FIG. 10 illustrates a third embodiment of the equipment assembly and related structure of the present invention.

FIGS. 10 and 11 show a third embodiment of the present invention which differs from the first embodiment only in that the cooled air at 55° F. ± is fed into the casing via a ceiling duct 2a located in the ceiling plenum 4b and an inlet duct 25 rather than from a position beneath the floor 2. This is helpful when no access flooring has been installed in the room 1, for example.

Figure 13:
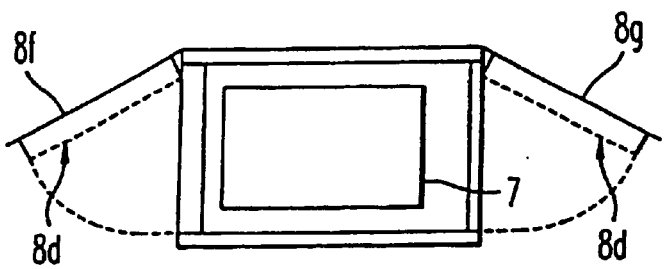
FIG. 13 is a top plan view thereof with the panels being shown in an open position.
Figure 12:
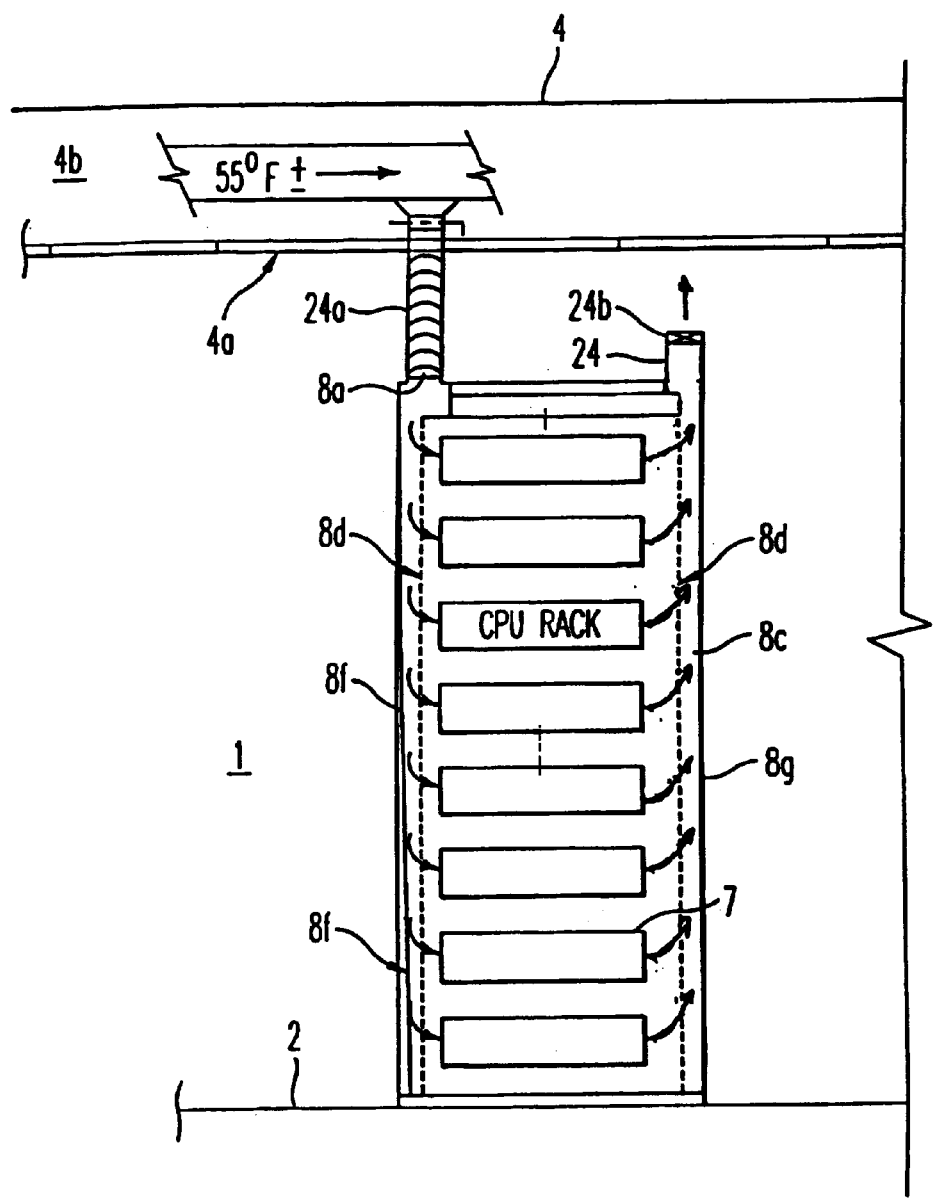
FIG. 12 shows a fourth embodiment of the equipment assembly and related structure in accordance with the present invention.

FIGS. 12 and 13 are similar respectively to the fourth embodiment shown in FIGS. 10 and 11 but wherein the outlet duct 24 exhausts the heated air into the room 1 via the fan 24b.

Figure 22:
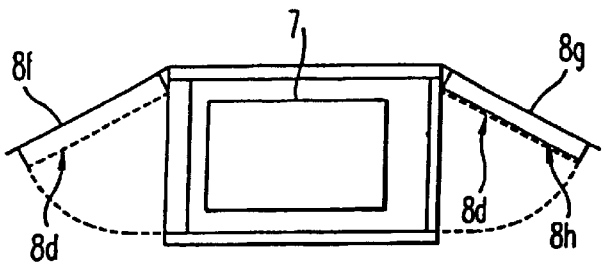
FIG. 22 is a top plan view showing the panels of the equipment assembly in an open position.
Figure 20:
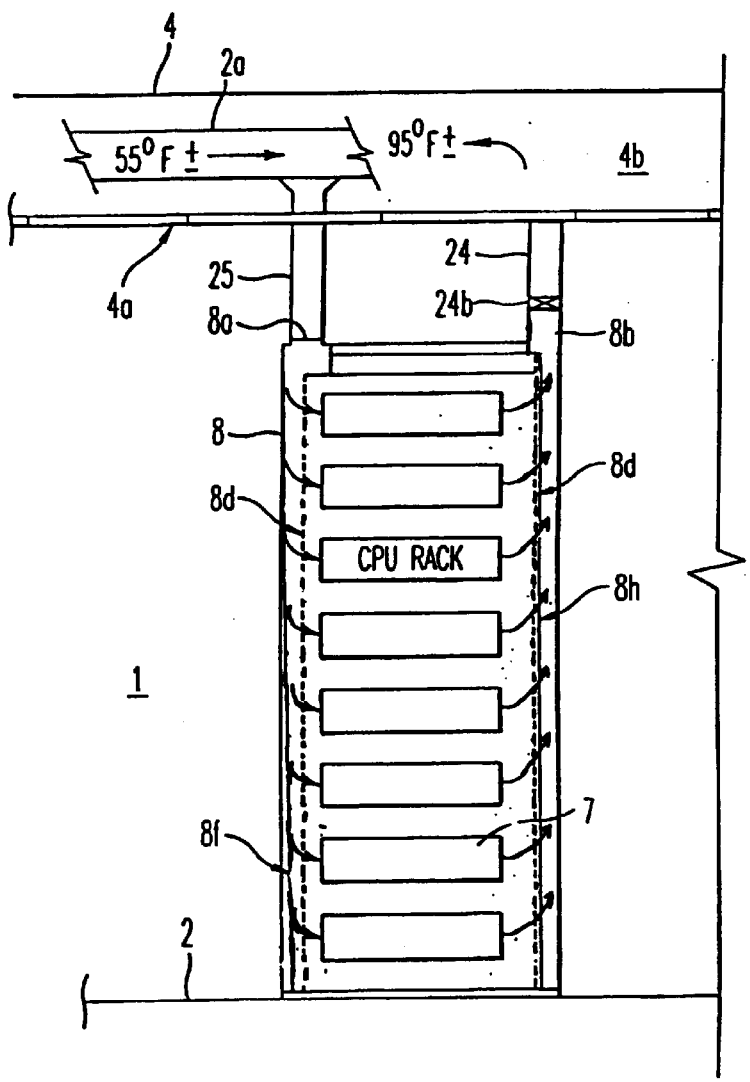
FIG. 20 shows a seventh embodiment of the equipment assembly and related structure of the present invention.
Figure 21:
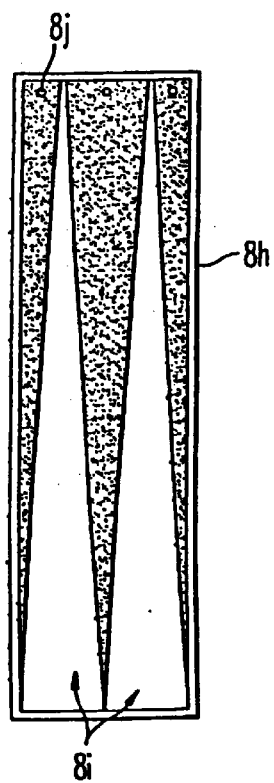
FIG. 21 shows a side elevational view of the solid panel in the embodiment shown in FIG. 20.

FIGS. 14–16 show a fifth embodiment utilizing the structure shown in FIGS. 6 and 7, but which also includes a rear solid panel 8h having triangular shaped openings or slots 8i therein, as viewed in elevation as shown in the elevational view appearing in FIG. 15. In a similar manner, the sixth embodiment shown in FIGS. 17 and 19 correspond, respectively, with the structure shown in FIGS. 8 and 9 wherein FIG. 18 shows the triangular openings 8i formed in solid rear panel 8h. Correspondingly the seventh embodiment illustrated in FIGS. 20 and 22, respectively, correspond to the structure shown in FIGS. 10 and 11 and the eighth embodiment shown in FIGS. 23 and 25 corresponds to the structure shown in FIGS. 12 and 13, respectively. FIG. 21 shows an elevational view of the opening 8 in a solid panel 8h of FIGS. 20 and 22 while FIG. 24 illustrates an elevational view of the opening 8i in solid panel 8h of FIGS. 22 and 25. FIG. 15 also shows one inch diameter openings 8j.

In each of the embodiments noted above, the flow control and the equipment assembly is advantageous independently of the delta T feature discussed above due to the flow control advantage provided as discussed above.

The advantage of utilizing a solid plate panel 8h with triangular openings or slots 8i adjacent to the perforated plate 8d in the cavity back door is that such provides equal airflow into the cavity backdoor from the rack-mounted equipment. The use of a solid plate panel 8h with the specific arrangement of openings 8i in panel 8h to the rear perforated plate 8d equalizes the air-flow into the cavity backdoor thereby providing a more effective heat removal from the rack-mounted equipment. The panel 8h also has a one inch diameter opening 8j as shown in FIG. 21. It would be understood that panel 8h could also be used on the upstream side of the rack 7 if such panel was inverted from the orientation shown in FIG. 15.

Additional advantages and modifications readily occur to those skilled in the art. Therefore, the invention in its broader aspects is not limited to specific details, and the illustrated examples shown and described herein. Accordingly, various modifications may be made without departing from the spirit or scope of the general inventive concept as defined by the appended claims and their equivalents.

What is claimed is:

1. An air conditioning method, comprising the steps of:
supplying cooling air generated from a cooling apparatus into one of a first plenum formed below a floor of a room and a first plenum located above the floor;
guiding the cooling air within the first plenum to an equipment assembly disposed in the room through an opening located in the equipment assembly;
communicating the cooling air introduced into the equipment assembly and heated by the equipment assembly into a second plenum separated from the room after cooling the equipment assembly, said plenum communicating the equipment assembly with the cooling apparatus;
returning the air released from and heated by the equipment assembly into the second plenum; and
communicating the released air through the cooling apparatus for cooling the released air.

2. A method as claimed in claim 1, which comprises guiding the air released from the equipment assembly through at least one duct into the plenum.

3. The method according to claim 2, which comprises guiding the air in the air passageway into the equipment assembly, guiding the air in the equipment assembly into an additional plenum connected to the equipment assembly and introducing the air in the additional plenum into said at least one duct for return of the released air to the cooling apparatus.

4. The method as claimed in claim 1, which comprises cooling the cooling air generated from the cooling apparatus to a temperature of substantially 55° F.

5. The method according to claim 4, which comprises heating the air released from the equipment assembly to a temperature of substantially 95° F. prior to communicating such air to the cooling apparatus by said second plenum.

6. The method according to claim 1, wherein a temperature differential between the air supplied to the air passageway from the cooling apparatus and the air released into the plenum from the equipment assembly is substantially 40° F.

7. The method according to claim 1, which comprises positioning a fan between the cooling apparatus and the air passageway formed in the floor and blowing the air into the passageway towards the equipment assembly by said fan.

8. An air conditioning method, comprising the steps of:
supplying cooling air generated from a cooling apparatus into one of a first plenum formed below a floor and a first plenum located above the floor;
guiding the cooling air within the first plenum to an equipment assembly disposed in the room through an opening located in the equipment assembly;
communicating the cooling air introduced into the equipment assembly into a second plenum after cooling the equipment assembly;
returning the air released from the equipment assembly into the second plenum; and communicating the released air through the cooling apparatus for cooling the released air; wherein the guiding of the cooling air to the equipment assembly includes passing the cooling air over a panel angled in a direction of flow of the air which forms a progressively smaller passage.

9. An air conditioning method, comprising the steps of:
supplying cooling air generated from a cooling apparatus into one of a first plenum formed below a floor of a room and a first plenum located above the floor;
guiding the cooling air within the first plenum to an equipment assembly disposed in the room through an opening located in the equipment assembly;
communicating the cooling air introduced into the equipment assembly into a second plenum after cooling the equipment assembly;
returning the air released from the equipment assembly into the second plenum;
communicating the released air through the cooling apparatus for cooling the released air; and
controlling the flow of the air released from the equipment assembly into the second plenum by providing a substantially equal air-flow into a rear plenum member located downstream of the equipment to be cooled.

10. The method according to claim 9, wherein the rear plenum member comprises a panel having at least one tapered opening extending in a longitudinal direction of the panel for controlling air-flow into the second plenum.

11. An air conditioning assembly, which comprises:
a cooling apparatus in communication with an air passageway formed at one of a position located below a floor of a room and a position within a ceiling plenum for introducing cooling air into the passageway; an equipment assembly positioned in the room, the equipment assembly having an opening in communication with an opening formed at one of a position in the floor and a position in the ceiling for controlling air-flow to the equipment assembly and for controlling communication of the cooling air from the cooling apparatus;
a plenum separated from the room and in communication with the equipment assembly for receiving air flowing from the equipment assembly which has been heated by the equipment assembly, said plenum communicating the air heated by the equipment assembly to one of a position of the cooling apparatus and a position of a cooling apparatus positioned outside the room for cooling the air heated by the equipment.

12. An air conditioning assembly as claimed in claim 11, which comprises at least one duct interconnecting the equipment assembly to the plenum for communicating air heated by the cooling equipment into the plenum for return to the cooling assembly.

13. The air conditioning assembly as claimed in claim 11, which comprises an additional plenum connected to the equipment apparatus for guiding air heated by the equipment apparatus into the plenum in communication with the cooling apparatus.

14. An air conditioning assembly as claimed in claim 11, wherein the cooling apparatus cools the cooling air to a temperature of substantially 55° F.

15. The air conditioning assembly as claimed in claim 11, wherein the equipment apparatus heats the air blowing into the plenum to a temperature of substantially 95° F. prior to communicating the air to the cooling appratus.

16. The air conditioning assembly according to claim 11, wherein a temperature differential between the air supplied to the air passageway and the air introduced into the plenum from the equipment assembly is substantially 40° F.

17. An air conditioning assembly as claimed in claim 11, wherein the equipment assembly comprises an upstream plenum for receiving the cooling air and a downstream plenum for receiving air for being released from the equipment assembly.

18. An air conditioning assembly, which comprises:
a cooling apparatus in communication with an air passageway formed at one of a position located below a floor of a room and a position within a ceiling plenum for introducing cooling air into the passageway;
an equipment assembly positioned in the room, the equipment assembly having an opening in communication with an opening formed at one of a position in the floor and a position in the ceiling for controlling air-flow to the equipment assembly and for controlling communication of the cooling air from the cooling apparatus; and
a plenum in communication with the equipment assembly for receiving air flowing from the equipment assembly which has been heated by the equipment assembly, said plenum communicating the air heated by the equipment assembly to one of a position of the cooling apparatus, a position in the room, and a position removed from the room for cooling the air heated by the equipment;
wherein at least one of said upstream plenum and said downstream plenum comprises a panel having an air-flow control member for providing a substantially equal air-flow over the panel within said one of said upstream plenum and said downstream plenum.

19. An air conditioning assembly as claimed in claim 18, wherein said panel air-flow control member comprises at least one tapered opening formed in said panel and extending in a longitudinal direction of the panel.

20. An air conditioning method, comprising the steps of:
supplying cooling air generated from a cooling apparatus into one of a first plenum formed below a floor and a first plenum located above the floor;
guiding the cooling air within the first plenum to an equipment assembly disposed in a room through an opening located in the floor;
communicating the cooling air introduced into the equipment assembly into a second plenum separated from the room after cooling the equipment assembly; and
returning the air released from the equipment assembly into the second plenum and communicating the released air through the cooling apparatus for cooling the released air.

21. An air conditioning method, comprising the steps of:
supplying cooling air generated from a cooling apparatus into one of a first plenum formed below a floor and a first plenum located above the floor;
guiding the cooling air within the first plenum to an equipment assembly disposed in a room through an opening located in the floor; and
communicating the cooling air introduced into the equipment assembly into a second plenum after cooling the equipment assembly plenum;
returning the air released from the equipment assembly into the second plenum and communicating the released air through the cooling apparatus for cooling the released air; and
controlling the communicating of the cooling air introduced into the equipment assembly so as to provide a uniform flow of the cooling air across a vertical face portion of the equipment assembly.

22. A method as claimed in claim 21, which comprises guiding the air released from the equipment assembly through at least one duct into the second plenum.

23. The method according to claim 22, which comprises guiding the air in the first plenum into the equipment assembly, guiding the air in the equipment assembly into an additional plenum connected to the equipment assembly and introducing the air in the additional plenum into said at least one duct for return of the released air to the cooling apparatus.

24. The method as claimed in claim 20, wherein the cooling air generated from the cooling apparatus is of a temperature of substantially 55° F.

25. The method according to claim 24, which comprises heating the air released from the equipment assembly to a temperature of substantially 95° F. prior to communicating such air to the cooling apparatus.

26. The method according to claim 20, wherein a temperature differential between the air supplied to the air passageway from the cooling apparatus and the air released into the plenum from the equipment assembly is substantially 40° F.

27. The method according to claim 20, which comprises positioning a fan between the cooling apparatus and the air passageway formed in the floor and blowing the air into the passageway towards the equipment assembly by said fan.

28. The method according to claim 20, wherein the room comprises a computer room and wherein the cooling apparatus and equipment assembly are positioned in the computer room.

29. The method according to claim 20, wherein the room comprises a computer room and wherein the cooling assembly is located outside the computer room.

30. The method according to claim 20, wherein said equipment assembly comprises at least one computer processing unit.

31. An air conditioning method, comprising the steps of:
supplying cooling air generated from a cooling apparatus into one of a first plenum formed below a floor and a first plenum located above the floor;
guiding the cooling air within the first plenum to an equipment assembly disposed in a room through an opening located in the floor;
communicating the cooling air introduced into the equipment assembly into a second plenum after cooling the equipment assembly plenum;
returning the air released from the equipment assembly into the second plenum and communicating the released air through the cooling apparatus for cooling the released air; and
guiding the cooling air into the equipment assembly by passing the cooling air over a panel angled in a direction of flow of the air to form a progressively smaller passage.

32. An air conditioning method, comprising the steps of:
supplying cooling air generated from a cooling apparatus into one of a first plenum formed below a floor and a first plenum located above the floor;
guiding the cooling air within the first plenum to an equipment assembly disposed in a room through an opening located in the floor;
communicating the cooling air introduced into the equipment assembly into a second plenum after cooling the equipment assembly plenum;
returning the air released from the equipment assembly into the second plenum and communicating the released air through the cooling apparatus for cooling the released air; and
controlling the flow of air released from the equipment assembly into the second plenum by providing a substantially equal air-flow into a rear plenum member located downstream of the equipment to be cooled.

33. The method according to claim 32, wherein the rear plenum member comprises a panel having at least one tapered opening extending in a longitudinal direction of the panel for controlling air-flow into the second plenum.

34. An air conditioning assembly, which comprises:
a cooling apparatus in communication with an air passageway formed below a floor of a room for introducing cooling air into the passageway;
an equipment assembly positioned in the room, the equipment having an upstream opening in communication with an opening formed in the floor for receiving the cooling air from the cooling apparatus;
a plenum in communication with the equipment assembly for receiving air flowing from the equipment assembly which has been heated by the equipment assembly, said plenum being separated from the room and communicating the air heated by the equipment assembly to at least one of the cooling apparatus for being cooled and a cooling apparatus positioned remote from the room.

35. An air conditioning assembly as claimed in claim 34, which comprises at least one duct interconnecting the equipment assembly to the plenum for communicating air heated by the cooling equipment into the plenum for return to the cooling assembly.

36. The air conditioning assembly as claimed in claim 34, which comprises an additional plenum connected to the equipment apparatus for guiding air heated by the equipment apparatus into the plenum in communication with the cooling apparatus.

37. An air conditioning assembly as claimed in claim 34, wherein the cooling apparatus cools the cooling air to a temperature of substantially 55° F.

38. The air conditioning assembly as claimed in claim 34, wherein the equipment apparatus heats the air blowing into the plenum to a temperature of substantially 95° F.

39. The air conditioning assembly according to claim 34, wherein a temperature differential between the air supplied to the air passageway and the air introduced into the plenum from the equipment assembly is substantially 40° F.

40. An air conditioning assembly as claimed in claim 34, wherein the equipment assembly comprises an upstream plenum for receiving the cooling air and a downstream plenum for receiving air for being released from the equipment assembly.

41. An air conditioning assembly, which comprises:
a cooling apparatus in communication with an air passageway formed below a floor of a room for introducing cooling air into the passageway;
an equipment assembly positioned in the room, the equipment having an upstream opening in communication with an opening formed in the floor for receiving the cooling air from the cooling apparatus; and
a plenum in communication with the equipment assembly for receiving air flowing from the equipment assembly which has been heated by the equipment assembly, said plenum communicating the air heated by the equipment assembly to at least one of a position of the cooling apparatus for being cooled, a position within the room, and a position remote from the room;

wherein at least one of said upstream panel and said downstream panel comprises a panel having an air-flow control member for providing a substantially equal air-flow over the panel within said one of said upstream plenum and said downstream plenum.

42. An air conditioning assembly, which comprises:

a cooling apparatus in communication with an air passageway formed below a floor of a room for introducing cooling air into the passageway;

an equipment assembly positioned in the room, the equipment having an upstream opening in communication with an opening formed in the floor for receiving the cooling air from the cooling apparatus; and a plenum in communication with the equipment assembly for receiving air flowing from the equipment assembly which has been heated by the equipment assembly, said plenum communicating the air heated by the equipment assembly to one of a position of the cooling apparatus for being cooled, a position within the room, and a position remote from the room;

wherein said panel air-flow control member comprises at least one tapered opening formed in said panel and extending in a longitudinal direction of the panel.

43. An air conditioning assembly as claimed in claim 34, wherein the equipment assembly comprises an upstream plenum for receiving the cooling air and a downstream plenum to receive air for being released from the equipment assembly.

44. An air conditioning method comprising steps of:

supplying cooling air generated from a cooling apparatus into one of a first plenum formed below a floor and a first plenum located above the floor;

guiding the cooling air within the first plenum to an equipment assembly disposed in a room through an opening located in the floor;

communicating the cooling air introduced into the equipment assembly into a second plenum after cooling the equipment assembly plenum;

returning the air released from the equipment assembly into the second plenum and communicating the released air through the cooling apparatus for cooling the released air;

wherein at least one of said upstream plenum and said downstream plenum comprises a panel angled in a direction of flow so as to form a progressively smaller passage for control of air-flow.

45. An air conditioning method comprising steps of:

supplying cooling air generated from a cooling apparatus into one of a first plenum formed below a floor and a first plenum located above the floor;

guiding the cooling air within the first plenum to an equipment assembly disposed in a room through an opening located in the floor;

communicating the cooling air introduced into the equipment assembly into a second plenum after cooling the equipment assembly plenum;

returning the air released from the equipment assembly into the second plenum and communicating the released air through the cooling apparatus for cooling the released air;

wherein at least one of said upstream panel and said downstream panel comprises a panel having an air-flow control member to provide a substantially equal air-flow over the panel within said one of said upstream plenum and said downstream plenum.

46. An air conditioning method comprising steps of:

supplying cooling air generated from a cooling apparatus into one of a first plenum formed below a floor and a first plenum located above the floor;

guiding the cooling air within the first plenum to an equipment assembly disposed in a room through an opening located in the floor;

communicating the cooling air introduced into the equipment assembly into a second plenum after cooling the equipment assembly plenum;

returning the air released from the equipment assembly into the second plenum and communicating the released air through the cooling apparatus for cooling the released air;

wherein the cooling air generated from the cooling apparatus is of a temperature of substantially 55° F.; and wherein said panel air-flow control member comprises at least one tapered opening formed in said panel and extruding in a longitudinal direction of the panel.

47. The method according to claim 1, which comprises positioning at least one fan in proximity with the equipment assembly for assisting the flow of air through the equipment assembly.

48. The method according to claim 8, which comprises positioning at least one fan in proximity with the equipment assembly for assisting the flow of air through the equipment assembly.

49. The method according to claim 9, which comprises positioning at least one fan in proximity with the equipment assembly for assisting the flow of air through the equipment assembly.

50. The method according to claim 21, which comprises positioning at least one fan in proximity with the equipment assembly for assisting the flow of air through the equipment assembly.

51. The method according to claim 31, which comprises positioning at least one fan in proximity with the equipment assembly for assisting the flow of air through the equipment assembly.

52. The method according to claim 32, which comprises positioning at least one fan in proximity with the equipment for assisting the flow of air through the equipment assembly.

53. The method according to claim 42, which comprises positioning at least one fan in proximity with the equipment assembly for assisting the flow of air through the equipment assembly.

54. The method according to claim 44, which comprises positioning at least one fan in proximity with the equipment assembly for assisting the flow of air through the equipment assembly.

55. The method according to claim 45, which comprises positioning at least one fan in proximity with the equipment assembly for assisting the flow of air through the equipment assembly.

56. The method according to claim 46, which comprises positioning at least one fan in proximity with the equipment for assisting the flow of air through the equipment assembly.

57. The apparatus according to claim 11, which comprises at least one fan positioned in proximity with the equipment assembly for assisting the flow the air through the equipment assembly.

58. The apparatus according to claim 18, which comprises at least one fan in proximity with the equipment assembly for assisting the flow of air through the equipment assembly.

59. The apparatus according to claim 31, which comprises positioning at least one fan in proximity with the equipment assembly for assisting the flow of air through the equipment assembly.

60. The apparatus according to claim 34, which comprises positioning at least one fan in proximity with the equipment assembly for assisting the flow of air through the equipment assembly.

61. The apparatus according to claim 41, which comprises positioning at least one fan in proximity with the equipment assembly for assisting the flow of air through the equipment assembly.

62. The apparatus according to claim 42, which comprises positioning at least one fan in proximity with the equipment assembly for assisting the flow of air through the equipment assembly.

63. An air conditioning method, comprising the steps of:

supplying cooling air generated from a cooling apparatus into an air passageway formed below a floor;

guiding the cooling air within the air passageway through an opening formed in the floor and controlling the flow of cooling air to equipment located in an equipment assembly via an air control member, the equipment assembly having an input opening in proximity with the opening located in the floor, said air flow control member being positioning in the equipment assembly so as to substantially evenly distribute cooling air to the equipment located in the equipment assembly;

communicating the cooling air introduced into the equipment assembly so as to be heated and communicating the heated air into a plenum separated from the room;

introducing the air released into the plenum from said equipment into the plenum and communicating the released air from the equipment assembly via the plenum through the cooling apparatus for cooling apparatus for cooling the released air; and positioning at least one fan in proximity with the equipment assembly for assisting the flow of air through the equipment assembly.

64. An air conditioning assembly, which comprises:

a cooling apparatus in communication with an air passageway formed below a floor of a room for introducing cooling air into the passageway;

an equipment assembly positioning on the floor, the equipment having an opening in communication with an opening formed in the floor for receiving the cooling air from the cooling apparatus;

a flow control member positioned upstream of said equipment assembly so as to substantially evenly distribute the cooling air to the equipment located in the equipment assembly;

a plenum separated from the room and in communication with the equipment assembly for receiving air flowing from the equipment assembly which has been heated by the equipment assembly, said plenum communicating the air heated by the equipment assembly back to the cooling apparatus for being cooled; and at least one fan located in proximity with the equipment assembly for assisting the flow of air through the equipment assembly.

* * * * *